(12) United States Patent
Dyer et al.

(10) Patent No.: US 9,059,177 B2
(45) Date of Patent: Jun. 16, 2015

(54) DOPING OF COPPER WIRING STRUCTURES IN BACK END OF LINE PROCESSING

(71) Applicant: International Business Machines Corporation, Armonk, NY (US)

(72) Inventors: Thomas W. Dyer, Pleasant Valley, NY (US); Daniel C. Edelstein, White Plains, NY (US); Tze-man Ko, Hopewell Junction, NY (US); Andrew H. Simon, Fishkill, NY (US); Wei-tsu Tseng, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/274,962

(22) Filed: May 12, 2014

(65) Prior Publication Data

US 2014/0246776 A1    Sep. 4, 2014

Related U.S. Application Data

(62) Division of application No. 13/599,256, filed on Aug. 30, 2012, now Pat. No. 8,765,602.

(51) Int. Cl.
*H01L 21/768* (2006.01)
*H01L 23/52* (2006.01)
*H01L 23/532* (2006.01)

(52) U.S. Cl.
CPC .... *H01L 23/53238* (2013.01); *H01L 21/76886* (2013.01); *H01L 21/76834* (2013.01); *H01L 21/76846* (2013.01); *H01L 21/76849* (2013.01); *H01L 21/76867* (2013.01); *H01L 21/76873* (2013.01); *H01L 2924/0002* (2013.01)

(58) Field of Classification Search
USPC .................................................. 257/734–786
See application file for complete search history.

(56) References Cited

U.S. PATENT DOCUMENTS

2012/0061838 A1*    3/2012    Edelstein et al. ............. 257/751

OTHER PUBLICATIONS

List of IBM Patents or Patent Applications Treated as Related, p. 1, May 12, 2014.

* cited by examiner

*Primary Examiner* — Mamadou Diallo
(74) *Attorney, Agent, or Firm* — Cantor Colburn LLP; Catherine Ivers

(57) ABSTRACT

A method of forming a metal interconnect structure includes forming a copper line within an interlevel dielectric (ILD) layer; directly doping a top surface of the copper line with a copper alloy material; and forming a dielectric layer over the ILD layer and the copper alloy material; wherein the copper alloy material serves an adhesion interface layer between the copper line and the dielectric layer.

4 Claims, 9 Drawing Sheets

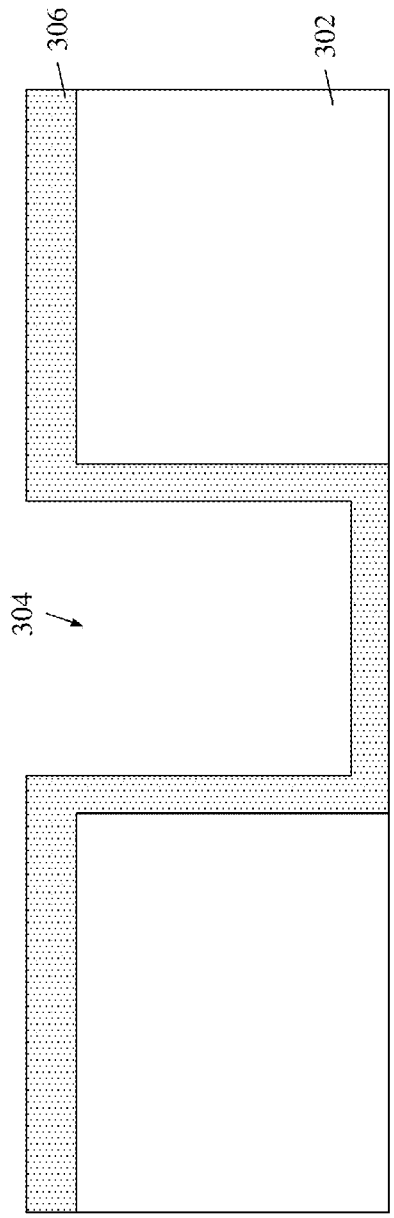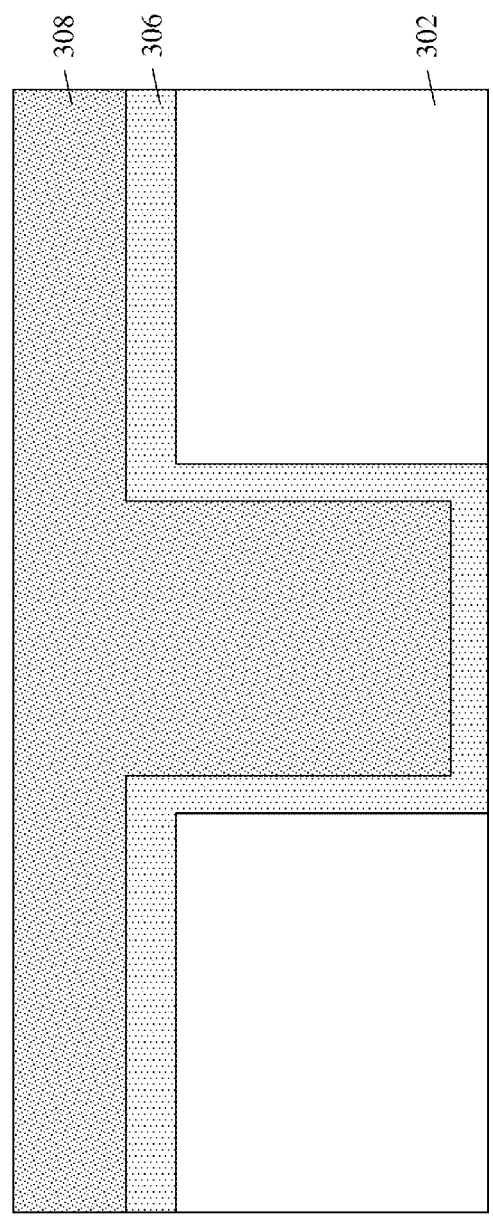

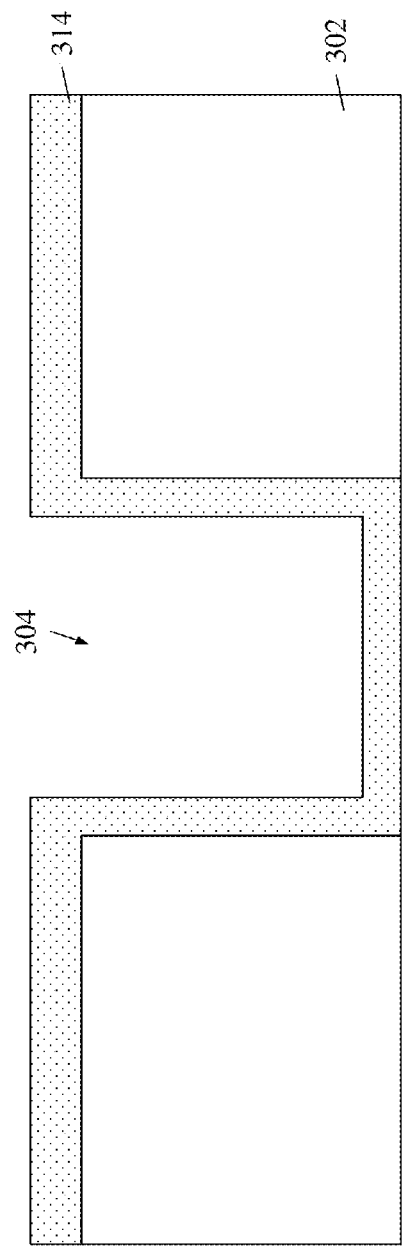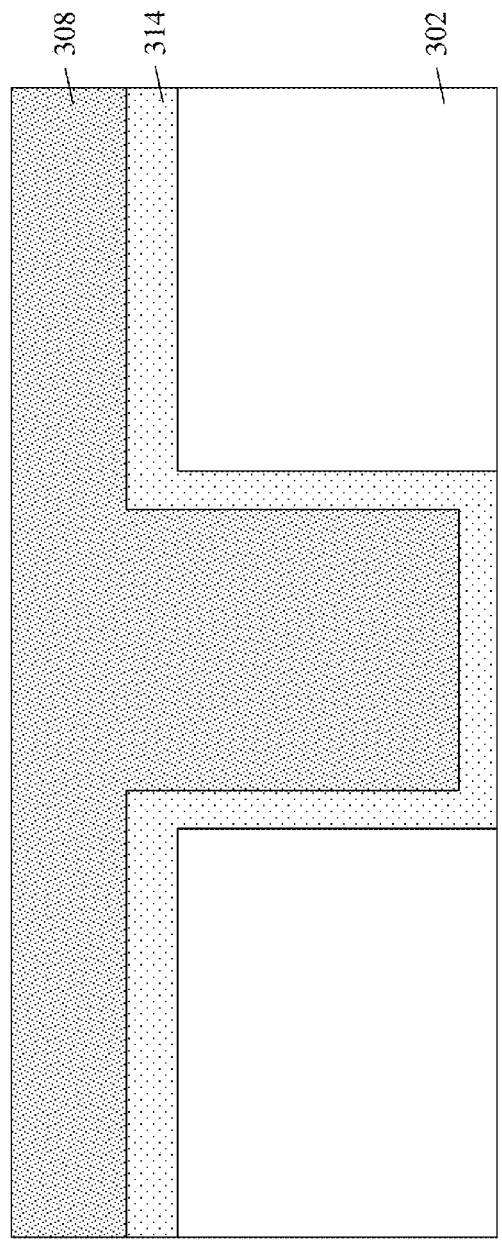
Figure 7
Figure 8

DOPING OF COPPER WIRING STRUCTURES IN BACK END OF LINE PROCESSING

CROSS-REFERENCE TO RELATED APPLICATION

This application is a divisional of U.S. patent application Ser. No. 13/599,256, filed Aug. 30, 2012, now U.S. Pat. No. 8,765,602, the disclosure of which is incorporated by reference herein in its entirety.

BACKGROUND

The present disclosure relates generally to semiconductor device manufacturing techniques and, more particularly, to doping of copper wiring structures in back end of line (BEOL) processing.

Integrated circuits are typically fabricated with multiple levels of patterned metallization lines, which are electrically separated from one another by interlayer dielectrics containing vias at selected locations, to provide electrical connections between levels of the patterned metallization lines. In recent years, copper (Cu) has replaced aluminum (Al) as the metal of choice for wiring of microelectronic devices, such as microprocessors and memories. However, copper has a tendency to diffuse through insulators, such as silicon dioxide, during high temperature processes. As a result, the use of copper wiring also necessitates the placement of efficient diffusion barriers surrounding the copper wires, thereby keeping the copper atoms confined to the intended wiring locations and preventing circuit malfunctions, such as shorts.

As electronic devices become smaller, there is also a continuing desire in the electronics industry to increase the circuit density in electronic components, e.g., integrated circuits, circuit boards, multi-chip modules, chip test devices, and the like, without degrading electrical performance, e.g., without introducing cross-talk capacitive coupling between wires while at the same time increasing speed or signal propagation of these components. One method for accomplishing these goals is to reduce the dielectric constant of the dielectric material in which the wires are embedded. Toward this end, a new class of low dielectric constant (low-K) materials has been created. Low-K interlevel dielectric (ILD) materials are advantageous so long as device reliability is not compromised. However, the lower the dielectric constant of the low-K dielectric material, the more challenging the integration becomes. For example, low-K generally corresponds to lower modulus, lower thermal conductivity, increased porosity, and greater susceptibility to plasma damage, in turn leading to lower reliability.

SUMMARY

In an exemplary embodiment, a method of forming a metal interconnect structure includes forming a copper line within an interlevel dielectric (ILD) layer; directly doping a top surface of the copper line with a copper alloy material; and forming a dielectric layer over the ILD layer and the copper alloy material; wherein the copper alloy material serves an adhesion interface layer between the copper line and the dielectric layer.

In another embodiment, a method of forming a metal interconnect structure includes forming an opening within an interlevel dielectric (ILD) layer; forming a first seed layer in the opening; forming a copper layer in the opening over the first seed layer; planarizing the copper layer and the first seed layer so as to define a copper line; directly doping a top surface of the copper line with a copper alloy material; and forming a dielectric layer over the ILD layer and the copper alloy material; wherein the copper alloy material serves an adhesion interface layer between the copper line and the dielectric layer.

In another embodiment, a metal interconnect structure includes a copper line formed within an interlevel dielectric (ILD) layer; a barrier layer surrounding bottom and sidewall surfaces of the copper line; a top surface of the copper line directly doped with a copper alloy material; and a dielectric layer formed over the ILD layer and the copper alloy material; wherein the copper alloy material serves an adhesion interface layer between the copper line and the dielectric layer.

BRIEF DESCRIPTION OF THE SEVERAL VIEWS OF THE DRAWINGS

Referring to the exemplary drawings wherein like elements are numbered alike in the several Figures:

FIGS. 3 through 6 are a series of cross-sectional views illustrating a method of doping the top surface of the copper line with a metal dopant, in which:

FIG. 3 illustrates an ILD layer having a wiring opening patterned therein, and a high doped seed layer formed over the top surface of the ILD layer;

FIG. 4 illustrates a copper layer electroplated over the seed layer of FIG. 3;

FIG. 5 illustrates chemical mechanical planarization or polishing (CMP) of the excess copper layer and seed layer of FIG. 4;

FIG. 6 illustrates a layer of NBLoK formed over the layer and the copper layer of FIG. 5, resulting in diffusion of the dopant species from the seed layer into the copper layer;

FIGS. 7 through 12 are a series of cross-sectional views illustrating a method of a metal interconnect structure by doping the top surface of the copper line with a metal dopant, in accordance with an exemplary embodiment, in which:

FIG. 7 illustrates an ILD layer having a wiring opening patterned therein, and a high doped seed layer formed over the top surface of the ILD layer;

FIG. 8 illustrates a copper layer electroplated over the seed layer of FIG. 7;

FIG. 9 illustrates CMP of the excess copper layer and seed layer of FIG. 8;

FIG. 10 illustrates the formation of a high doped seed layer over the ILD layer, low concentration seed layer, and copper layer of FIG. 9;

FIG. 11 illustrates an anneal of the device of FIG. 10 so as to drive dopant atoms into the top surface of the copper layer, creating a doped region;

FIG. 12 illustrates removal of the high concentration seed layer of FIG. 11 and deposition of a NBLoK layer;

FIGS. 13 through 16 are a series of cross-sectional views illustrating an alternative embodiment of FIGS. 9 through 12, in which:

FIG. 13 illustrates CMP of the excess copper layer and seed layer of FIG. 8, wherein the copper layer and seed layer are recessed below the ILD layer;

FIG. 14 illustrates the formation of a high doped seed layer over the ILD layer, low concentration seed layer, and copper layer of FIG. 13;

FIG. 15 illustrates planarization of the portion of the high doped seed layer over the ILD layer of FIG. 14, leaving the high doped seed layer, and an anneal to drive dopant atoms into the top surface of the copper layer, creating a doped region;

FIG. 16 illustrates deposition of a NBLoK layer over the device of FIG. 15;

FIGS. 17 and 18 are cross-sectional views illustrating an alternative embodiment of FIGS. 15 and 16, in which:

FIG. 17 illustrates planarization of the portion of the high doped seed layer over the ILD layer of FIG. 14, leaving the high doped seed layer; and FIG. 18 illustrates deposition of an NBLoK layer over the device of FIG. 17.

DETAILED DESCRIPTION

Figure 2:
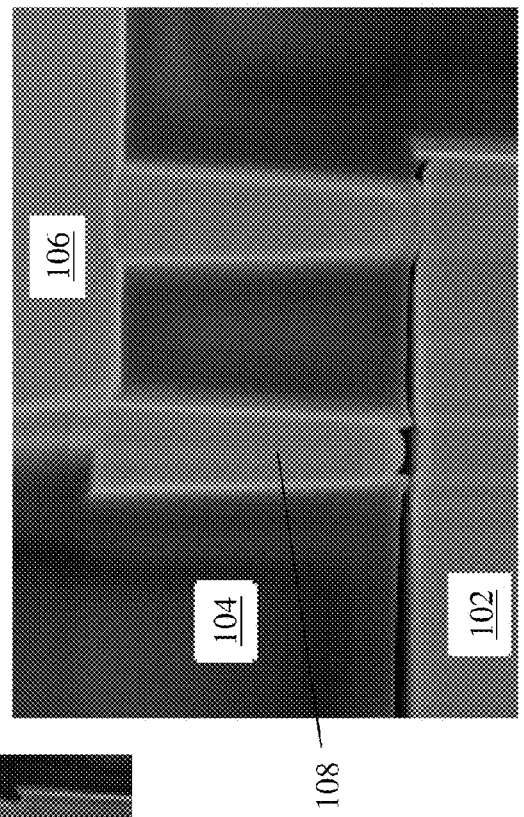
FIG. 2 is an enlarged image of a portion of FIG. 1, illustrating delamination of an NBLoK insulating layer.
Figure 1:
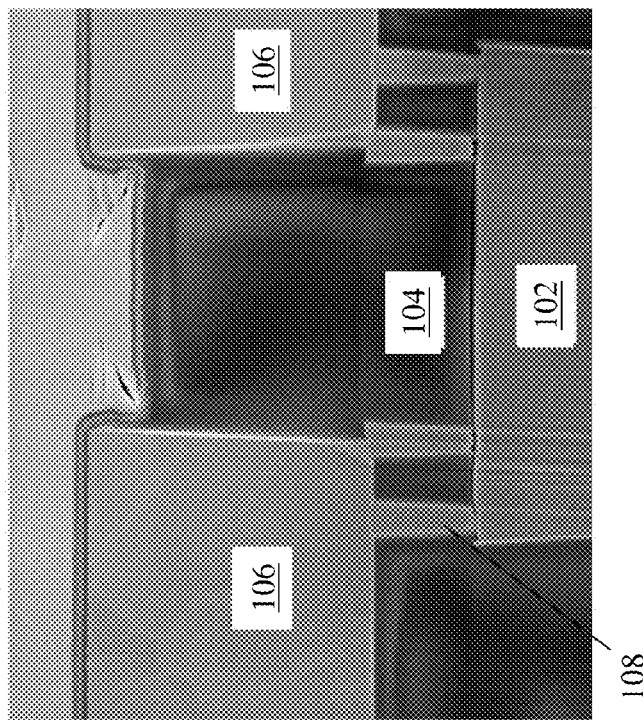
FIG. 1 is a scanning electron microscope (SEM) image illustrating delamination of an NBLoK insulating layer from a lower copper wiring line.

FIG. 1 is a scanning electron microscope (SEM) image illustrating delamination of an NBLoK insulating layer from a lower copper wiring line. As illustrated in FIG. 1, the lower copper wiring line 102 has a layer of NBLoK dielectric 104 formed thereupon. The lower copper wiring line 102 is intended to be electrically connected to an upper copper wiring line 106 by vias 108. However, as will be noted, due to the weak NBLoK adhesion to copper, delamination of the NBLoK dielectric 104 from the top surface of the lower copper wiring line 102 has also caused separation of the vias from the lower copper wiring line 102, in turn leading to device opens. This delamination is also more clearly depicted in the enlarged image of FIG. 2.

Adhesion between the copper lines and NBLoK can be greatly enhanced by doping the top surface of the copper line with a heavy noble metal, such as manganese (Mn). One possible manner of locating the Mn at the top surface is by using a copper manganese (CuMn) seed layer prior to copper plating, and thereafter thermally diffusing the Mn through the copper line up to the top surface, as illustrated in FIGS. 3-6.

As particularly shown in FIG. 3, an interlevel dielectric (ILD) layer 302 (e.g., oxide, nitride, low-k dielectrics, etc.) has a wiring opening 304 patterned therein, in accordance with damascene processing techniques. A seed layer 306 is formed over the top surface of the ILD layer 302, as well as over sidewall and bottom surfaces of the opening 304 in preparation for copper material plating. Although not specifically illustrated in FIG. 3, one skilled in the art will appreciate one or more barrier layers (e.g., tantalum, titanium based) may be formed over the ILD layer 302 prior to seed layer deposition.

In the example depicted, the seed layer 306 includes a CuMn alloy having a manganese dopant concentration of about 2% atomic. Notably, such a concentration is higher than typically may be used in conjunction with a CuMn seed layer for electromigration prevention purposes. In the latter case, such a seed layer concentration may only be on the order of about 0.5% atomic. Generally speaking, electromigration concerns are more prevalent for the smaller thicknesses of wiring on the lower levels. However, CuMn seed concentrations higher than about 0.5% atomic on these levels may have the disadvantage of significantly increasing line resistance. It will be noted that other metal materials may also be used for dopant alloy materials such as, for example, cobalt (Co), ruthenium (Ru), rhodium (Rh), palladium (Pd), silver (Ag), osmium (Os), iridium (Ir), platinum (Pt), and gold (Au).

Figure 5:
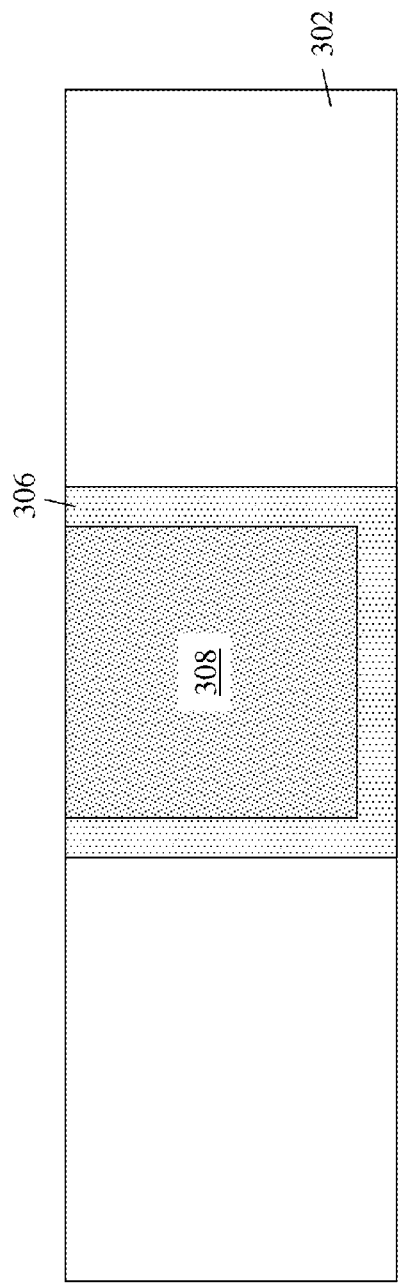
Figure 6:
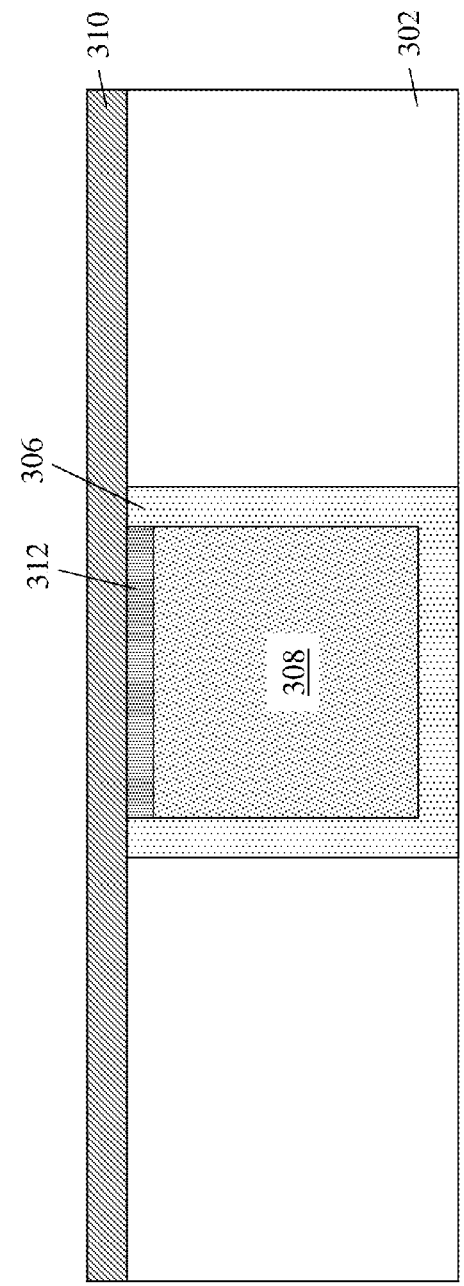

In FIG. 4, a copper layer 308 is electroplated over the seed layer 306 so as to completely overfill the opening. This is followed by chemical mechanical planarization or polishing (CMP) of the excess copper layer 308 and seed layer 306 (and barrier layer) to expose the top surface of the ILD layer 302, as shown in FIG. 5. Then, as shown in FIG. 6, a layer of NBLoK 310 is formed over the ILD layer 302 and the copper layer 308. The deposition occurs at an elevated temperature of about 400° C., resulting in diffusion of the Mn species from the seed layer 306 into the copper layer 308. Those Mn atoms which diffuse to the top surface of the copper layer 308 are depicted by region 312 in FIG. 6, wherein the doped region 312 is intended to promote a better adhesion interface between the copper layer 308 and the NBLoK layer 310. Layer 302, in a preferred embodiment is NBLoK, but can be any dielectric layer which inhibits copper diffusion.

One difficulty, however, with a seed layer/diffusion approach to top surface doping is relatively large thickness (e.g., about 3 micron (µm)) of copper line the dopant atoms must travel to reach the surface. As a result, the doping levels of the Mn at the doped region 312 are relatively low, which ultimately limits the adhesion benefit of the Mn. In other words, it is difficult to get enough Mn through the thick copper lines to reach the top surface where it is beneficial for adhesion. In addition, the increase in Mn concentration at the seed layer will increase the line resistance of the copper lines, as compared to lines having a lower CuMn seed layer concentration, or lines having only a Cu seed layer. Moreover, diffusion through the entire line structure also leads to larger variability in the line resistances themselves.

Accordingly, FIGS. 7 through 12 are a series of cross-sectional views illustrating a method of forming a metal interconnect structure by doping the top surface of a copper line with a metal dopant, in accordance with an exemplary embodiment. The exemplary embodiment improves NBLoK-to-copper adhesion by directly doping the top surface of the copper lines with up to 2% CuMn (or other suitable copper alloy material). Specifically, an exemplary embodiment involves doping the top surface of the copper lines with an dopant material such as Mn by sputtering CuMn directly on the top surface of the copper lines, thermally driving the Mn into the copper surface, and thereafter removing the sputtered CuMn with a touch-up CMP step.

Figure 9:
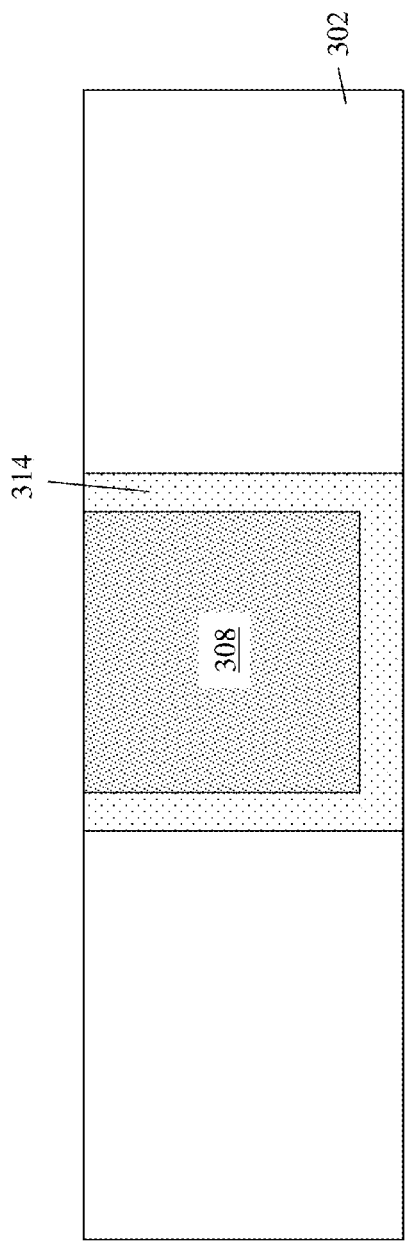

In comparison with the previously described technique, FIG. 7 illustrates an ILD layer 302 (e.g., oxide, nitride, etc.) having a wiring opening 304 patterned therein, in accordance with damascene processing techniques. A seed layer 314 is formed over the top surface of the ILD layer 302, as well as over sidewall and bottom surfaces of the opening 304 in preparation for copper material plating. However, whereas the seed layer 306 of FIG. 3 has the increased 2% CuMn concentration, the seed layer 314 may have a low CuMn concentration of about 0.5% atomic Mn, or perhaps no dopant material at all. In FIG. 8, a copper layer 308 is electroplated over the seed layer 314 so as to completely overfill the opening. This is followed by CMP of the excess copper layer 308 and seed layer 314 (and barrier layer, not shown), as shown in FIG. 9.

Figure 10:
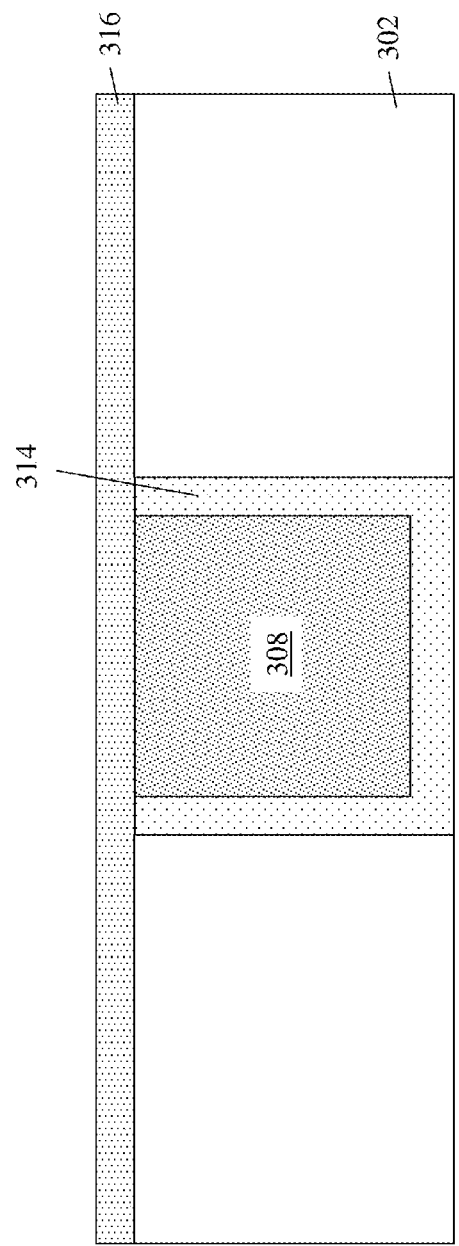
Figure 11:
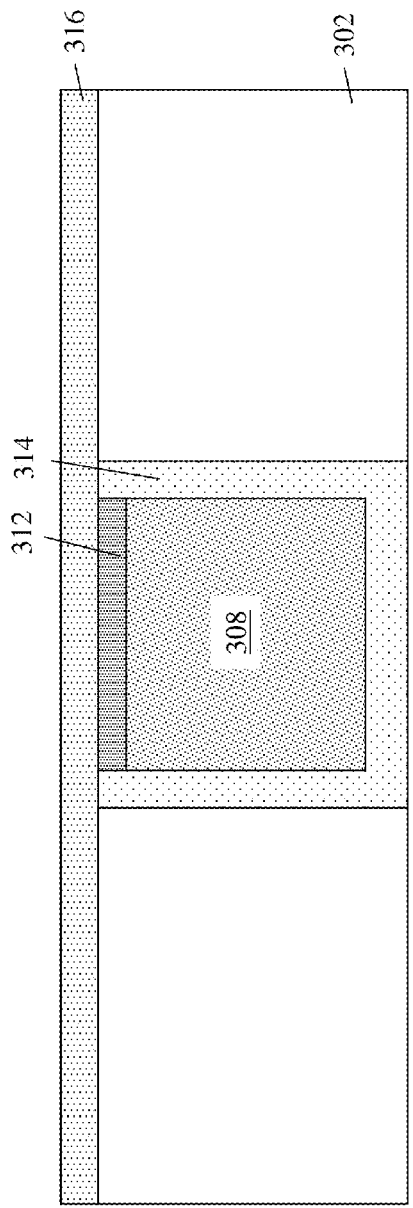
Figure 12:
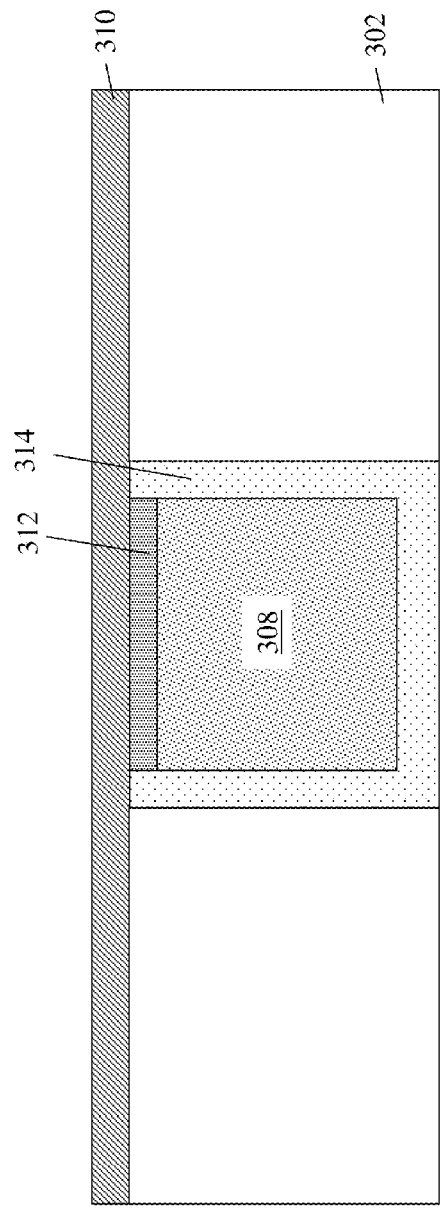

Then, as shown in FIG. 10, a high concentration CuMn seed layer 316 (e.g., 2% atomic Mn) is formed over the ILD layer 302, low concentration CuMn seed layer 314, and copper layer 308. The seed layer 316 may be formed by sputtering, for example. An anneal is then performed so as to drive Mn atoms into the top surface of the copper layer, creating a doped region 312 as shown in FIG. 11. The sputtered high concentration CuMn seed layer 316 is then removed such as by CMP, leaving the doped region 312 as an interface for better adhesion of NBLoK. The deposition of the NBLoK layer 310 is illustrated in FIG. 12.

Figure 13:
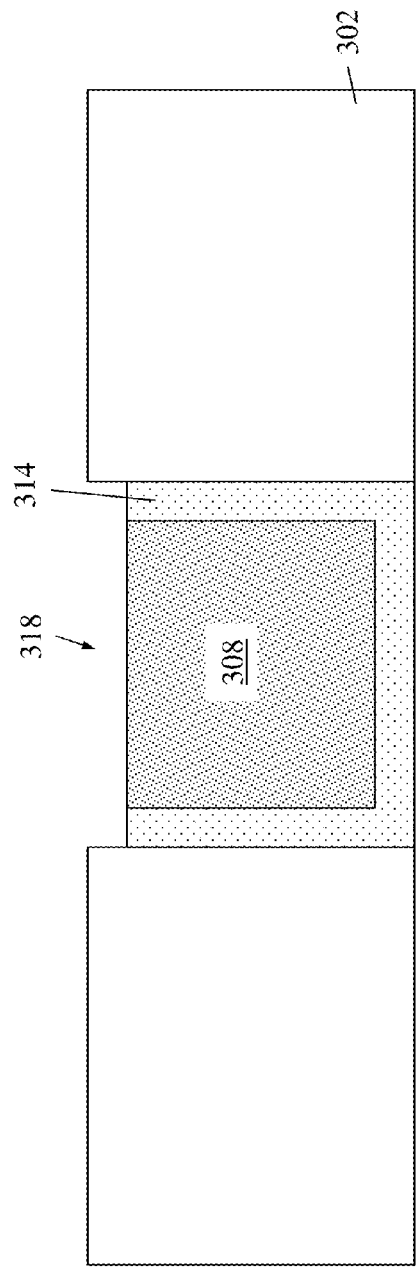
Figure 14:
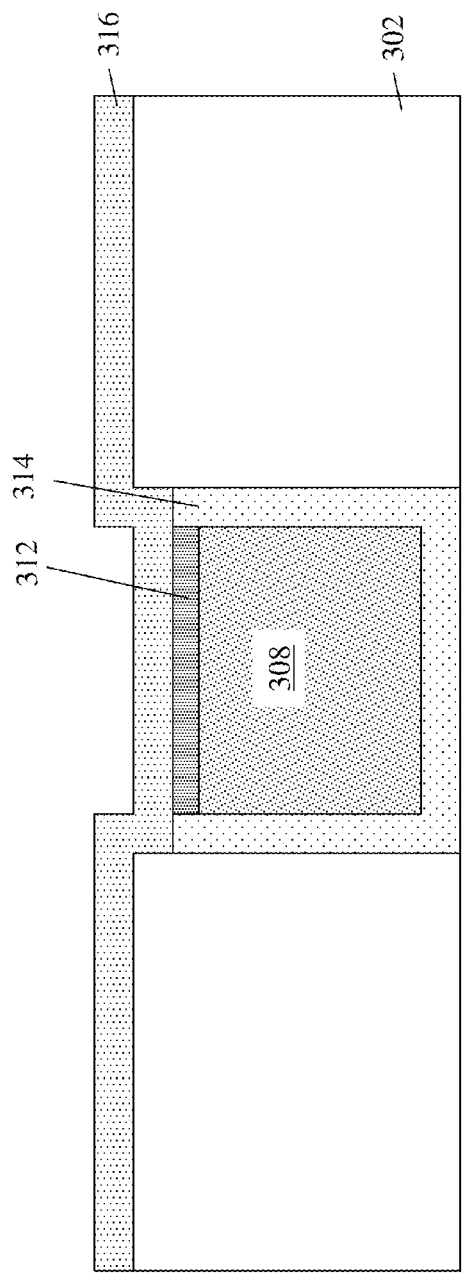

In an alternative embodiment, following the processing shown in FIG. 8, the copper layer 308 and seed layer 314 may be further recessed below the top surface of the ILD layer 302, such as by intentional dishing (over-polish) during CMP or by a separate wet etch step to create a recess 318 as shown in FIG. 13. The recess 318 may be on the order of about 0.2 µm in depth, for example. Then, as shown in FIG. 14, a high concentration CuMn seed layer 316 (e.g., 2% atomic Mn) is formed over the ILD layer 302, low concentration CuMn seed layer 314, and copper layer 308. Again, the seed layer 316 may be formed by sputtering, for example. In one embodiment, an anneal may then be performed as described above so as to drive Mn atoms into the top surface of the copper layer, creating a doped region 312.

Figure 15:
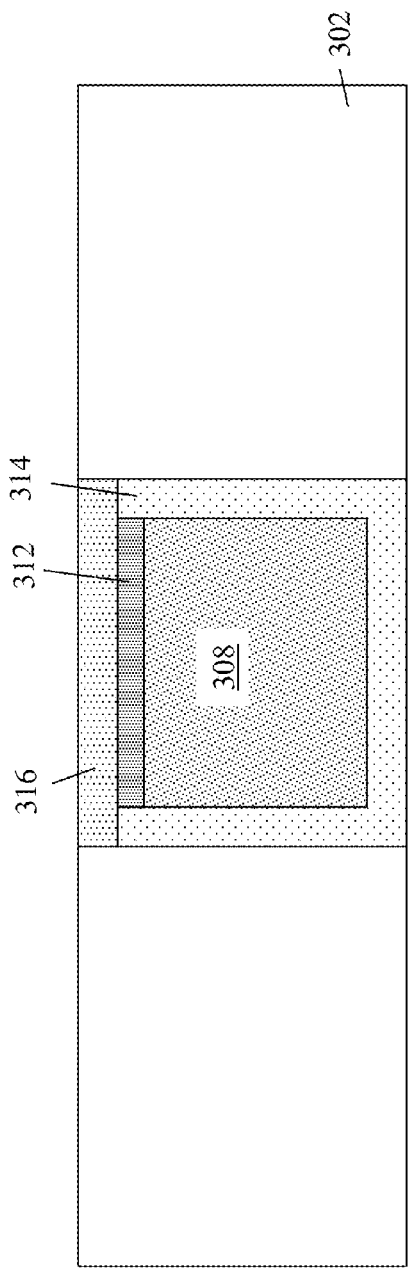
Figure 16:
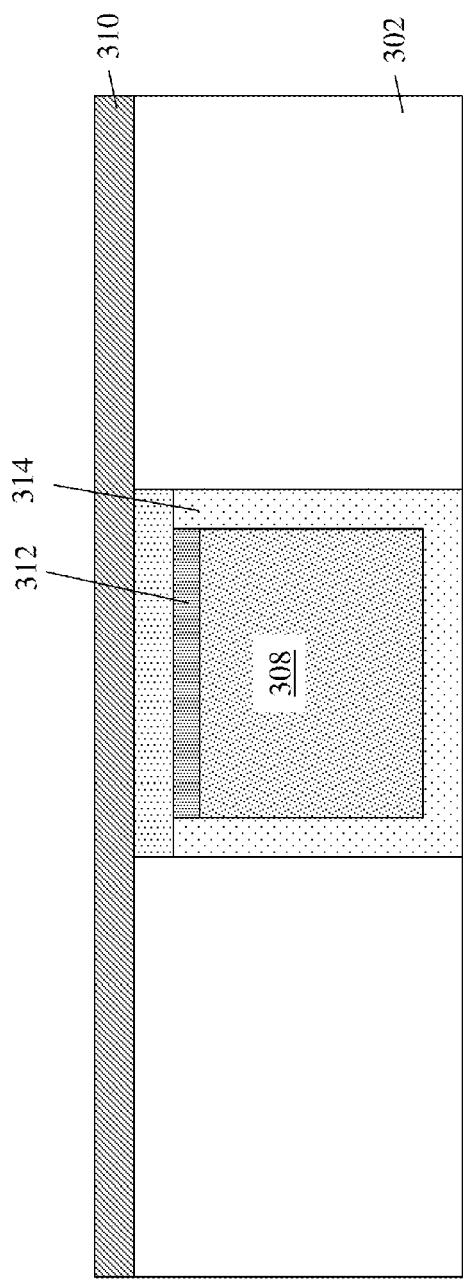

As shown in FIG. 15, the portions of the high concentration CuMn seed layer 316 atop the ILD layer 302 may be removed by CMP, leaving a portion of the high concentration CuMn seed layer 316 over the low concentration CuMn seed layer 314 and copper layer 308. As such, the combination of the doped region 312 and remaining high concentration CuMn seed layer 316 provide an interface for better adhesion of NBLoK by ensuring high Mn doping (~2%) on this surface. The deposition of the NBLoK layer 310 is illustrated in FIG. 16.

Figure 17:
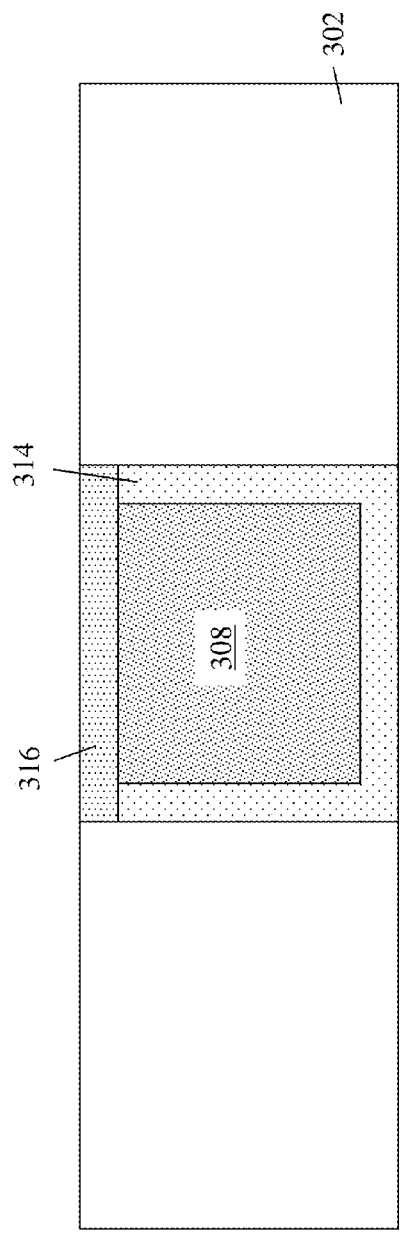
Figure 18:
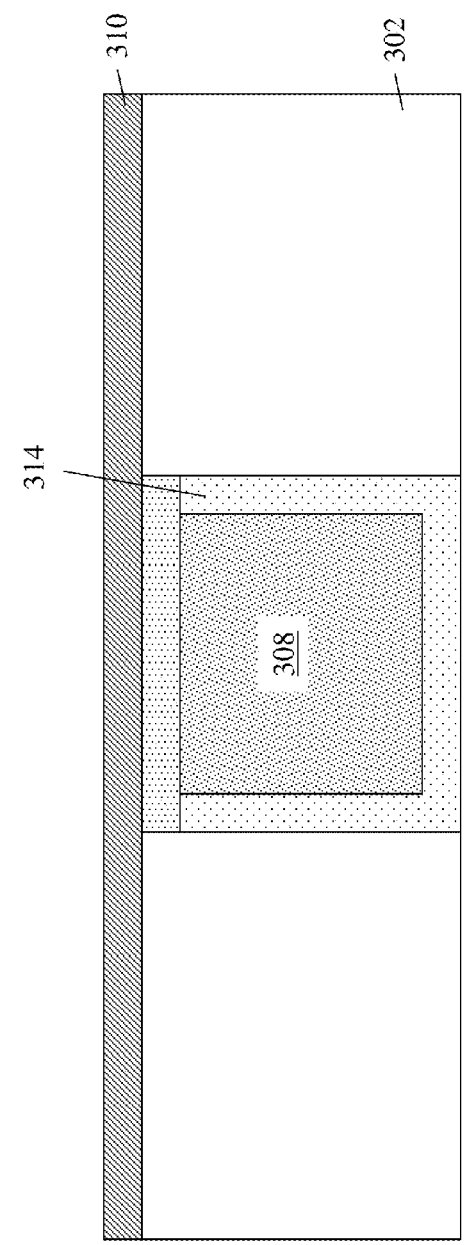

In still another embodiment, because of the recessing in FIG. 13, which leaves a portion of the high concentration CuMn seed layer 316 atop the low concentration CuMn seed layer 314 and copper layer 308, an anneal need not be performed. That is, as shown in FIG. 17, the sputtered high concentration CuMn seed layer 316 atop the low concentration CuMn seed layer 314 and copper layer 308 serves as the interface for the subsequently deposited NBLoK layer. The deposition of the NBLoK layer 310 is illustrated in FIG. 18.

As discussed above, prior to forming a low concentration CuMn seed layer or perhaps a Cu seed layer in a patterned opening, a diffusion barrier layer is typically formed prior to seed layer deposition. It will be noted that a similar barrier layer(s) may also be formed prior to deposition of the high concentration CuMn seed layer 316.

While the disclosure has been described with reference to a preferred embodiment or embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A metal interconnect structure, comprising:
   a copper line formed within an interlevel dielectric (ILD) layer;
   a barrier layer surrounding bottom and sidewall surfaces of the copper line, with a sidewall of the copper line having a sidewall copper alloy concentration;
   a top surface of the copper line directly doped with a copper alloy material, the top surface of the copper line having a top copper alloy concentration, wherein the top copper alloy concentration is greater than the sidewall copper alloy concentration; and
   a dielectric layer formed over the ILD layer and the copper alloy material;
   wherein the copper alloy material serves an adhesion interface layer between the copper line and the dielectric layer.

2. The structure of claim 1, wherein:
   the copper alloy material comprises a doped region of CuMn having a manganese concentration of greater than 0.5% atomic; and
   the dielectric layer comprises an NBLoK (SiC(N,H)) layer.

3. The structure of claim 1, wherein the copper line has a thickness of about 3 microns (µm).

4. The structure of claim 1, wherein:
   the top surface of the copper line is directly doped with a copper alloy material comprising a copper manganese (CuMn) seed layer having a manganese concentration of about 2.0% atomic; and
   the dielectric layer comprises NBLoK (SiC(N,H)).

* * * * *